US011384268B2

(12) United States Patent
Yamazaki et al.

(10) Patent No.: US 11,384,268 B2
(45) Date of Patent: Jul. 12, 2022

(54) CURABLE SILICONE COMPOSITION FOR DIE BONDING USE

(71) Applicant: Dow Corning Toray Co., Ltd., Tokyo (JP)

(72) Inventors: Ryosuke Yamazaki, Chiba (JP); Shinichi Yamamoto, Chiba (JP)

(73) Assignee: DuPont Toray Specialty Materials Kabushiki Kaisha, Tokyo (JP)

( * ) Notice: Subject to any disclaimer, the term of this patent is extended or adjusted under 35 U.S.C. 154(b) by 459 days.

(21) Appl. No.: 16/619,343

(22) PCT Filed: Jun. 19, 2018

(86) PCT No.: PCT/JP2018/023212
§ 371 (c)(1),
(2) Date: Dec. 4, 2019

(87) PCT Pub. No.: WO2019/003995
PCT Pub. Date: Jan. 3, 2019

(65) Prior Publication Data
US 2020/0115603 A1 Apr. 16, 2020

(30) Foreign Application Priority Data
Jun. 26, 2017 (JP) .............................. JP2017-124377

(51) Int. Cl.
*C08G 77/12* (2006.01)
*C09J 183/04* (2006.01)
*C08G 77/08* (2006.01)
C08K 3/36 (2006.01)
C08K 5/5435 (2006.01)

(52) U.S. Cl.
CPC ............ *C09J 183/04* (2013.01); *C08G 77/08* (2013.01); *C08G 77/12* (2013.01); *C08K 3/36* (2013.01); *C08K 5/5435* (2013.01); *C08K 2201/006* (2013.01); *C09J 2203/326* (2013.01)

(58) Field of Classification Search
CPC ........ C08G 77/12; C08G 77/20; C08G 77/70; C08L 83/04; B01J 23/40; C08K 3/36; C09J 183/00; H01L 24/29
See application file for complete search history.

(56) References Cited

U.S. PATENT DOCUMENTS

| | | | |
|---|---|---|---|
| 5,254,656 A | 10/1993 | Bilgrien et al. | |
| 5,300,569 A | 4/1994 | Drake et al. | |
| 5,616,632 A | 4/1997 | Fujiki et al. | |
| 6,040,361 A | 3/2000 | Fujiki et al. | |
| 6,297,332 B1 | 10/2001 | Urakami et al. | |
| 7,534,659 B2 | 5/2009 | Sutoh et al. | |
| 8,772,812 B2 | 7/2014 | Yoshitake et al. | |
| 9,012,586 B2 | 4/2015 | Yoshitake et al. | |
| 9,403,982 B2 | 8/2016 | Fujisawa et al. | |
| 9,536,799 B2 | 1/2017 | Yoshida et al. | |
| 9,660,157 B2 | 5/2017 | Yamazaki et al. | |
| 9,853,193 B2 | 12/2017 | Amako et al. | |
| 2001/0011117 A1 | 8/2001 | Pesch et al. | |
| 2006/0057779 A1 | 3/2006 | Sutoh et al. | |
| 2006/0089455 A1 | 4/2006 | Sterin et al. | |
| 2007/0224800 A1 | 9/2007 | Miyoshi | |
| 2011/0224344 A1 | 9/2011 | Fujisawa et al. | |
| 2013/0161686 A1 | 6/2013 | Yoshitake et al. | |
| 2015/0315427 A1 | 11/2015 | Yoshida et al. | |

FOREIGN PATENT DOCUMENTS

| | | |
|---|---|---|
| AU | 2003249594 A1 | 2/2004 |
| CN | 1239116 | 12/1999 |
| CN | 1668715 A | 9/2005 |
| CN | 102959015 A | 3/2013 |
| CN | 104870585 A | 8/2015 |
| EP | 476224 A1 | 3/1992 |
| EP | 586151 A1 | 3/1994 |
| EP | 918067 A2 | 5/1999 |
| EP | 953588 A2 | 11/1999 |

(Continued)

OTHER PUBLICATIONS

English language abstract for KR 2011-0082525 extracted from espacenet.com database on Oct. 12, 2020, 2 pages.
English language abstract for KR 2015-0054875 extracted from espacenet.com database on Oct. 12, 2020, 1 page.
International Search Report for Application No. PCT/JP2018/023212 dated Aug. 14, 2018, 2 pages.
English language abstract for CN 1239116 extracted from espacenet.com database on Dec. 12, 2019, 1 page.
English language abstract for CN 1668715 extracted from espacenet.com database on Dec. 11, 2019, 3 pages.
English language abstract for CN 102959015 extracted from espacenet.com database on Dec. 12, 2019, 2 pages.
English language abstract for CN 104870585 extracted from espacenet.com database on Dec. 12, 2019, 2 pages.

(Continued)

*Primary Examiner* — Kuo Liang Peng
(74) *Attorney, Agent, or Firm* — Howard & Howard Attorneys PLLC (57) ABSTRACT

A curable silicone composition for die bonding use contains at least (A) an organopolysiloxane having at least two alkenyl groups per molecule, (B) an organopolysiloxane having at least two siloxane units each represented by the formula: RHSiO (wherein R represents a monovalent hydrocarbon group having 1 to 12 carbon atoms and having no aliphatic unsaturated bond) per molecule, (C) a platinum-group metal-based catalyst for hydrosilylation reactions, (D) a hydrosilylation reaction inhibitor and (E) an adhesiveness-imparting agent, wherein the scorch time (ts1), which is defined in JIS K 6300-2, at a die bonding temperature is 20 to 60 seconds, and the 90% vulcanization time [tc(90)] with respect to the maximum torque value during the vulcanization time of 600 seconds is 300 to 500 seconds. The curable silicone composition for die bonding use according to the present invention can adhere a semiconductor chip to a support strongly.

12 Claims, 3 Drawing Sheets

(56) References Cited

FOREIGN PATENT DOCUMENTS

| | | | |
|---|---|---|---|
| EP | 1539898 | A1 | 6/2005 |
| EP | 2588539 | A1 | 5/2013 |
| EP | 2935494 | A1 | 10/2015 |
| GB | 2076841 | A | 12/1981 |
| JP | H04046962 | A | 2/1992 |
| JP | H06157913 | A | 6/1994 |
| JP | H06506004 | A | 7/1994 |
| JP | H07304956 | A | 11/1995 |
| JP | H11236508 | A | 8/1999 |
| JP | 2000017055 | A | 1/2000 |
| JP | 2004043814 | A | 2/2004 |
| JP | 2006137787 | A | 6/2006 |
| JP | 2007258317 | A | 10/2007 |
| JP | 2012012433 | A | 1/2012 |
| JP | 2012012434 | A | 1/2012 |
| JP | 2013251430 | A * | 12/2013 |
| JP | 2016504461 | A | 2/2016 |
| JP | 2016155967 | A | 9/2016 |
| KR | 19990083578 | A | 11/1999 |
| KR | 20050021485 | A | 3/2005 |
| KR | 20070095799 | A | 10/2007 |
| KR | 20110082525 | A | 7/2011 |
| KR | 20130112713 | A | 10/2013 |
| KR | 20150054875 | A | 5/2015 |
| KR | 20150099546 | A | 8/2015 |
| SG | 77680 | A1 | 1/2001 |
| TW | 457256 | B | 10/2001 |
| TW | 200405492 | A | 4/2004 |
| TW | 200741900 | A | 11/2007 |
| TW | 201209101 | A | 3/2012 |
| TW | 201430065 | A | 8/2014 |
| TW | 201609350 | A | 3/2016 |
| WO | 92003500 | A1 | 3/1992 |
| WO | 2004007628 | A1 | 1/2004 |
| WO | 2012002561 | A1 | 1/2012 |
| WO | 2014100656 | A1 | 6/2014 |

OTHER PUBLICATIONS

English language abstract and machine-assisted English translation for JPH 04-46962 extracted from espacenet.com database on Dec. 12, 2019, 8 pages.

English language abstract for JPH 06-157913 extracted from espacenet.com database on Dec. 12, 2019, 1 page.

English language abstract for JPH 06-506004 extracted from espacenet.com database on Dec. 12, 2019, 1 page.

English language abstract and machine-assisted English translation for JPH 07-304956 extracted from espacenet.com database on Dec. 12, 2019, 13 pages.

English language abstract for JPH 11-236508 extracted from espacenet.com database on Dec. 12, 2019, 1 page.

English language abstract for JP 2000-017055 extracted from espacenet.com database on Dec. 12, 2019, 1 page.

English language abstract for JP 2004-043814 extracted from espacenet.com database on Dec. 12, 2019, 3 pages.

English language abstract and machine-assisted English translation for JP 2006-137787 extracted from espacenet.com database on Dec. 12, 2019, 14 pages.

English language abstract for JP 2007-258317 extracted from espacenet.com database on Dec. 12, 2019, 2 pages.

English language abstract for JP 2012-012433 extracted from espacenet.com database on Dec. 12, 2019, 2 pages.

English language abstract for JP 2012-012434 extracted from espacenet.com database on Dec. 11, 2019, 2 pages.

English language abstract for JP 2016-504461 extracted from espacenet.com database on Dec. 12, 2019, 2 pages.

English language abstract for JP 2016-155967 extracted from espacenet.com database on Dec. 12, 2019, 1 page.

English language abstract for KR 1999-0083578 extracted from espacenet.com database on Dec. 12, 2019, 1 page.

English language abstract for KR 2005-0021485 extracted from espacenet.com database on Dec. 12, 2019, 2 pages.

English language abstract for KR 2007-0095799 extracted from espacenet.com database on Dec. 12, 2019, 2 pages.

English language abstract for KR 2013-0112713 extracted from espacenet.com database on Dec. 12, 2019, 2 pages.

English language abstract for KR 2015-0099546 extracted from espacenet.com database on Dec. 12, 2019, 2 pages.

English language abstract not found for SG 77680; however, see English language equivalent U.S. Pat. No. 6,297,332.

English language abstract for TW 457256 extracted from espacenet.com database on Dec. 12, 2019, 1 page.

English language abstract for TW 200405492 extracted from espacenet.com database on Dec. 12, 2019, 3 pages.

English language abstract for TW 200741900 extracted from espacenet.com database on Dec. 12, 2019, 2 pages.

English language abstract for TW 201209101 extracted from espacenet.com database on Dec. 12, 2019, 2 pages.

English language abstract for TW 201430065 extracted from espacenet.com database on Dec. 12, 2019, 2 pages.

English language abstract for TW 201609350 A extracted from espacenet.com database on Oct. 18, 2021, 2 pages.

* cited by examiner

CURABLE SILICONE COMPOSITION FOR DIE BONDING USE

CROSS-REFERENCE TO RELATED APPLICATIONS

The present application is the National Stage of International Patent Application No. PCT/JP2018/023212, filed on Jun. 19, 2018, which claims priority to and all the benefits of Japanese Application No. 2017-124377, filed on Jun. 26, 2017, which are both hereby expressly incorporated herein by reference in their entirety.

TECHNICAL FIELD

The present invention relates to a curable silicone composition for die bonding use.

BACKGROUND ART

Curable silicone compositions are used to adhere optical semiconductor elements such as LEDs to supports comprising sapphire, for example. As examples of such curable silicone compositions, Patent Literature 1 and Patent Literature 2 propose curable silicone compositions comprising essentially linear or cyclic alkenyl group-containing organopolysiloxane, branched alkenyl group-containing organopolysiloxane, linear organopolysiloxane having hydrogen atoms bonded to silicon atoms in the molecular chain, branched organopolysiloxane having silicon atom-bonded hydrogen atoms, and a hydrosilylation reaction catalyst, and Patent Literature 3 proposes a curable silicone composition comprising linear organopolysiloxane having at least 2 alkenyl groups per molecule, branched organopolysiloxane having at least 2 alkenyl groups per molecule, branched organopolysiloxane having at least 2 silicon atom-bonded hydrogen atoms per molecule, and a hydrosilylation reaction catalyst.

However, in the die bonding of optical semiconductor elements such as LEDs, the adhesive layer is extremely thin, and it is known that even the curable silicone compositions described above are disadvantageous in that they do not afford adequate adhesive strength (die shear strength).

PRIOR ART LITERATURE

Patent Literature
PATENT LITERATURE 1: Japanese Unexamined Patent Publication No. 2012-012433
PATENT LITERATURE 2: Japanese Unexamined Patent Publication No. 2012-012434
PATENT LITERATURE 3: Japanese Unexamined Patent Publication No. 2016-155967

SUMMARY OF THE INVENTION

Problems that the Invention is to Solve
The aim of the present invention is to provide a curable silicone composition for die bonding use, that can firmly adhere a semiconductor chip to a support.
Means of Solving the Problems
The inventive curable silicone composition for die bonding use comprises at least
(A) 100 parts by mass of organopolysiloxane having at least 2 alkenyl groups per molecule,
(B) organopolysiloxane having, per molecule, at least 2 siloxane units represented by the formula RHSiO (in the formula, R is a monovalent C1-12 hydrocarbon group having no aliphatic unsaturated bonds) {in an amount such that the molar ratio of the silicon atom-bonded hydrogen atoms in this component with respect to the alkenyl groups in component (A) is 0.1-10},
(C) platinum-group metal hydrosilylation reaction catalyst in an amount such that the amount, in mass units, of platinum-group metal in this component is 10 ppm with respect to the total amount of components (A) and (B),
(D) 0.001-5 parts by mass of hydrosilylation reaction inhibitor per 100 parts by mass of the total amount of components (A) and (B), and
(E) 0.01-10 parts by mass of adhesiveness-bestowing agent per 100 parts by m ass of the total amount of components (A) and (B),
and is characterized in that the scorch time (ts1) is 20-60 seconds at the die b onding temperature, specified in JIS K 6300-2, and, with respect to the maximu m torque value up to a vulcanization time of 600 seconds, the 90% vulcanizati on time [tc(90)] is 300-500 seconds.

Component (A) preferably contains an organopolysiloxane resin comprising at least a siloxane unit represented by the formula $R^1_3SiO_{1/2}$ (in the formula, $R^1$ is an identical or different monovalent C1-12 hydrocarbon group having no aliphatic unsaturated bonds), a siloxane unit represented by the formula $R^1_2R^2SiO_{1/2}$ (in the formula, $R^1$ is as described above, and $R^2$ is a C2-12 alkenyl group), and a siloxane unit represented by the formula $SiO_{4/2}$, wherein the molar ratio of the total amount of siloxane units represented by formula $R^1_3\ SiO_{1/2}$ and siloxane units represented by formula $R^1_2R^2SiO_{1/2}$, with respect to the siloxane unit represented by formula $SiO_{4/2,}$ is 0.5-1.6.

Component (B) is preferably an organopolysiloxane resin comprising at least a siloxane unit represented by the formula $R^4_3\ SiO_{1/2}$ (in the formula, $R^4$ is an identical or different monovalent C1-12 hydrocarbon group having no aliphatic unsaturated bonds), a siloxane unit represented by the formula $R^4HSiO_{2/2}$ (in the formula, $R^4$ is as described above), and a siloxane unit represented by the formula $SiO_{4/2}$, wherein the molar ratio of the siloxane unit represented by formula $R^4_3SiO_{4/2}$ is 0.6-1.5 and the molar ratio of the siloxane unit represented by formula $R^4HSiO_{2/2}$ is 1.5-3 with respect to the siloxane unit represented by formula $SiO_{4/2;}$ or an organopolysiloxane comprising at least a siloxane unit represented by the formula $R^4_3SiO_{1/2}$ (in the formula, $R^4$ is an identical or different monovalent C1-12 hydrocarbon group having no aliphatic unsaturated bonds) and a siloxane unit represented by the formula $R^4HSiO_{2/2}$ (in the formula, $R^4$ is as described above), and having no siloxane unit represented by the formula $SiO_{4/2}$.

Component (D) is preferably an alkyne alcohol and/or silylated alkyne alcohol.

Component (E) is preferably a reaction mixture comprising epoxy group-containing alkoxysilane and alkenyl group-containing diorganosiloxane oligomer having both molecular chain terminals silanol group-blocked.

The inventive composition preferably also contains (F) fumed silica having a BET specific surface area of 20-200 $m^2/g$, at 1-20 parts by mass per 100 parts by mass of the total amount of components (A) and (B).

The inventive composition is preferably such that when cured it forms a cured product having a type D durometer hardness, as defined in JIS K 6253-1997, of at least 50.

Also, the inventive composition is preferably such that when cured it forms a cured product having a flexural strain, as defined in JIS K 7171-1994, of at least 10%.

The inventive composition is preferably a curable silicone composition for die bonding use, for adhering LED elements to substrates.

EFFECTS OF THE INVENTION

A feature of the inventive curable silicone composition for die bonding use is that it can firmly adhere a semiconductor chip to a support.

MODES FOR CARRYING OUT THE INVENTION

Figure 1:
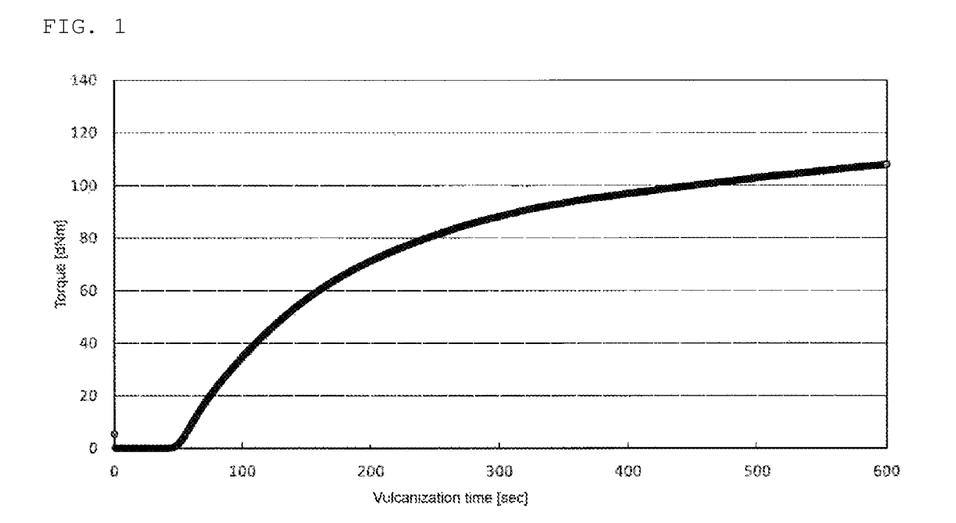
FIG. 1 A graph showing the vulcanization characteristics at 150° C. of the example 1 curable silicone composition for die bonding use.
Figure 2:
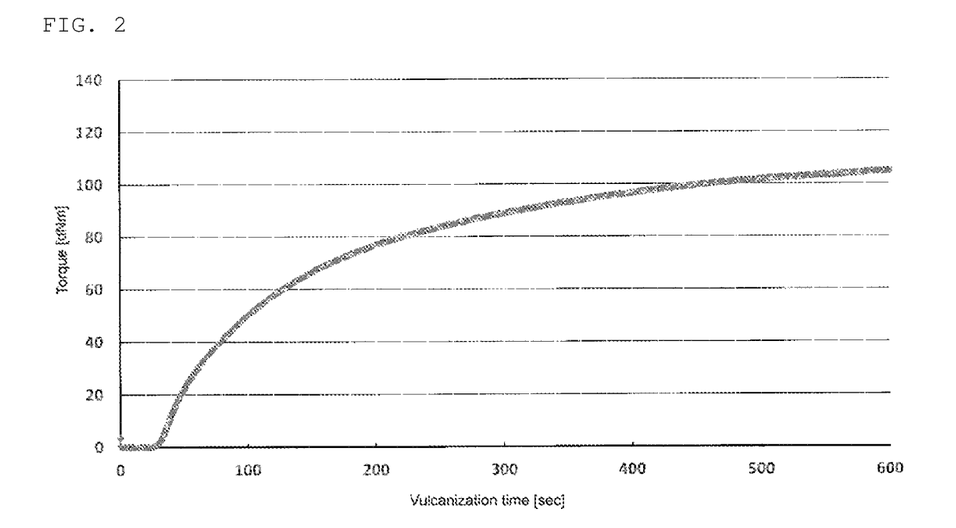
FIG. 2 A graph showing the vulcanization characteristics at 150° C. of the example 3 curable silicone composition for die bonding use.
Figure 3:
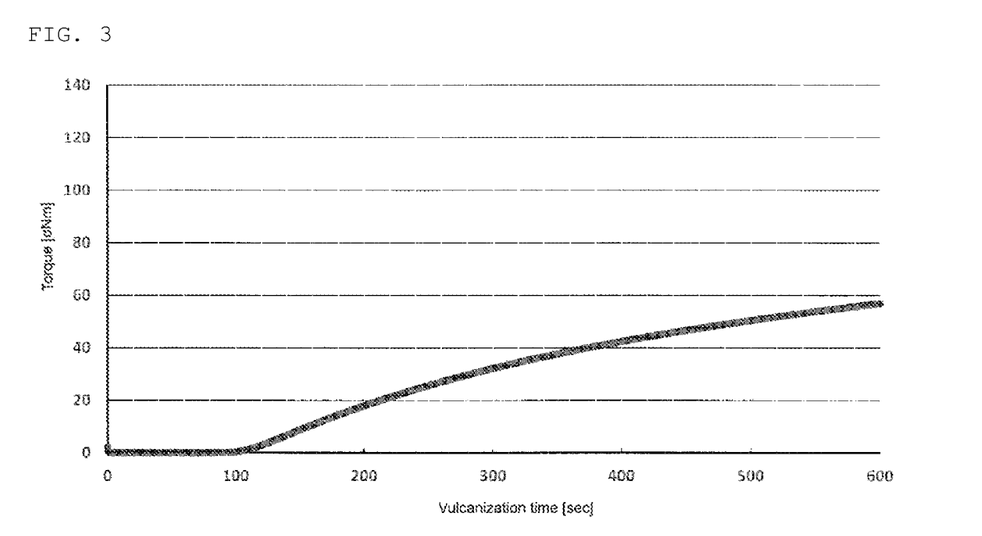
FIG. 3 A graph showing the vulcanization characteristics at 150° C. of the comparative example 3 curable silicone composition for die bonding use.
Figure 4:
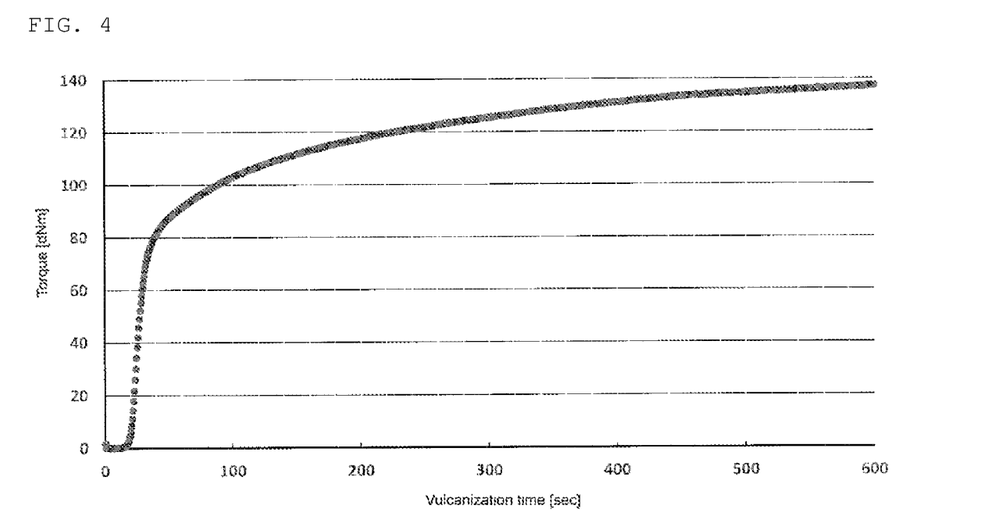
FIG. 4 A graph showing the vulcanization characteristics at 150° C. of the comparative example 6 curable silicone composition for die bonding use.
Figure 5:
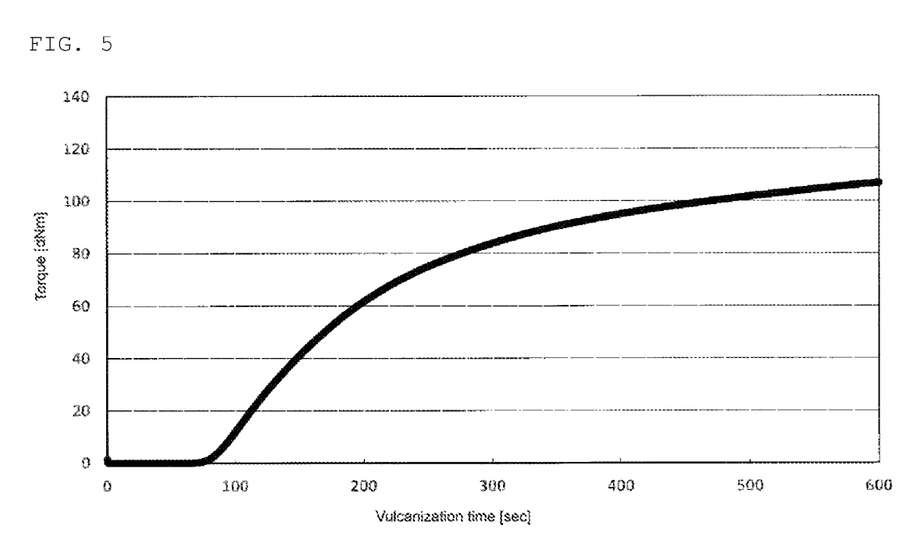
FIG. 5 A graph showing the vulcanization characteristics at 150° C. of the comparative example 7 curable silicone composition for die bonding use.

Component (A) is an organopolysiloxane having at least 2 alkenyl groups per molecule. Examples of the alkenyl groups are C2-12 alkenyl groups such as vinyl, allyl, butenyl, pentenyl, hexenyl, heptenyl, octenyl, nonenyl, decenyl, undecenyl, and dodecenyl groups; they are preferably vinyl groups. Examples of the silicon atom-bonded groups (other than alkenyl groups) also present in component (A) are C1-12 alkyl groups such as methyl, ethyl, propyl, isopropyl, butyl, isobutyl, cert-butyl, pentyl, neopentyl, hexyl, cyclohexyl, heptyl, octyl, nonyl, decyl, undecyl and dodecyl groups; C6-12 aryl groups such as phenyl, tolyl, xylyl and naphthyl groups; benzyl group and C7-12 aralkyl groups such as phenethyl, and phenylpropyl groups; and groups obtained by substituting some or all of the hydrogen atoms in these groups with halogen atoms such as fluorine, chlorine or bromine atoms. It should be noted that a small amount of hydroxyl group or alkoxy group such as methoxy or ethoxy group may be bonded to the silicon atom in component (A), provided that this does not adversely affect the aim of the present invention.

There are no limitations relating to the molecular structure of component (A); for example, it can be linear, linear with some branching, cyclic, branched, or a three-dimensional network structure. Component (A) is a single organopolysiloxane having such a molecular structure, or a mixture of two or more organopolysiloxanes having these molecular structures; it preferably contains at least organopolysiloxane resin having a branched or three-dimensional network structure, because this can afford adequate adhesive strength (chip die shear strength), and it is particularly preferably a mixture of organopolysiloxane that is linear or linear with some branching, and organopolysiloxane resin having a branched or three-dimensional network structure.

Examples of linear organopolysiloxanes include dimethylpolysiloxane having both molecular chain terminals dimethylvinylsiloxy group-blocked; dimethylsiloxane-methylphenylsiloxane copolymer having both molecular chain terminals dimethylvinylsiloxy group-blocked; dimethylsiloxane-methylvinylsiloxane copolymer having both molecular chain terminals dimethylvinylsiloxy group-blocked; methylphenylpolysiloxane having both molecular chain terminals dimethylvinylsiloxy group-blocked; dimethylsiloxane-methylvinylsiloxane copolymer having both molecular chain terminals trimethylsiloxy group-blocked; dimethylsiloxane-methylvinylsiloxane-methylphenylsiloxane copolymer having both molecular chain terminals trimethylsiloxy group-blocked; and mixtures of 2 or more thereof.

Furthermore, examples of organopolysiloxane resins having a branched or three-dimensional structure include those comprising at least a siloxane unit represented by the formula $R^1_3SiO_{1/2}$, a siloxane unit represented by the formula $R^1_2R^2SiO_{1/2}$ and a siloxane unit represented by the formula $SiO_{4/2}$.

In the formulae, $R^1$ are identical or different monovalent C1-12 hydrocarbon groups having no aliphatic unsaturated bonds, and $R^1$ denote C1-12 alkyl groups, C6-12 aryl groups or C7-12 aralkyl groups as described above, and are preferably methyl groups.

Also, in the formula, $R^2$ is a C2-12 alkenyl group, and denotes an alkenyl group as described above, and is preferably a vinyl group.

These organopolysiloxane resins comprise at least a siloxane unit represented by the formula $R^1_3SiO_{1/2}$, a siloxane unit represented by the formula $R^1_2R^2SiO_{1/2}$ and a siloxane unit represented by the formula $SiO_{4/2}$; and they may also contain a siloxane unit represented by the formula $R^1SiO_{3/2}$, provided that this does not adversely affect the aim of the present invention. Also, these organopolysiloxane resins may have hydroxyl groups or alkoxy groups bonded to silicon atoms within the molecule, provided that this does not adversely affect the aim of the present invention; the adhesiveness of the inventive composition can be improved by having polar groups such as hydroxyl groups and/or alkoxy groups, particularly hydroxyl groups, bonded to the silicon atoms in the molecule. It should be noted that the organopolysiloxane resin is preferably such that the molar ratio of the total amount of siloxane units represented by formula $R^1_3SiO_{1/2}$ and siloxane units represented by formula $R^1_2R_2SiO_{1/2}$, with respect to the siloxane unit represented by formula $SiO_{4/2}$, is preferably 0.5-1.6, or more preferably 0.6-1.5 or 0.6-1.4.

Examples of these organopolysiloxane resins are those represented by the average composition formulae below. In the formulae, Vi, Me and Ph represent vinyl group, methyl group and phenyl group, respectively.

$(ViMe_2SiO_{1/2})_{0.10}(Me_3SiO_{1/2})_{0.33}(SiO_{4/2})_{0.57}$
$(HO_{1/2})_{0.03}$ $(ViMe_2SiO_{1/2})_{0.13}(Me_3SiO_{1/2})_{0.35}(SiO_{4/2})_{0.52}$
$(HO_{1/2})_{0.02}$ $(ViMePhSiO_{1/2})_{0.10}(Me_3SiO_{1/2})_{0.45}(SiO_{4/2})_{0.43}$
$(HO_{1/2})_{0.03}$ $(ViMe_2SiO_{1/2})_{0.09}(Me_3SiO_{1/2})_{0.31}(SiO_{4/2})_{0.60}$
$(HO_{1/2})_{0.04}$ $(ViMe_2SiO_{1/2})_{0.10}(Me_3SiO_{1/2})_{0.40}(SiO_{4/2})_{0.50}$
$(HO_{1/2})_{0.03}$

Component (A) preferably contains at least this type of organopolysiloxane resin, and there are no limitations with regard to the amount contained; it preferably constitutes 40-90% by mass of component (A), and more preferably the lower limit is 50% by mass or 60% by mass and the upper limit is 80% by mass or 70% by mass. This is because when the organopolysiloxane resin content is at or above the abovementioned lower limit, the cured product obtained on curing the inventive composition can be very hard and tough, and when it is at or below the abovementioned upper limit, the inventive composition does not become too viscous and its handleability is good.

It should be noted that in order to lower the viscosity of the inventive composition and increase the hardness and mechanical strength of the cured product obtained on curing the inventive composition, an organopolysiloxane resin having a high alkenyl group content and low relative viscosity, as represented by the average composition formulae below, may be used in component (A) in addition to the abovementioned organopolysiloxane resin.

$$(ViMe_2SiO_{1/2})_{0.55}(Me_3SiO_{1/2})_{0.05}(SiO_{4/2})_{0.40}$$

$$(ViMe_2SiO_{1/2})_{0.13}(Me_3SiO_{1/2})_{0.45}(SiO_{4/2})_{0.40}$$

Moreover, in order to lower the viscosity of the inventive composition and increase the hardness and mechanical strength of the cured product obtained on curing the inventive composition, component (A) preferably contains alkenyl group-containing cyclic organopolysiloxane. This cyclic organopolysiloxane is represented by the average unit formula.

$$(R^3{}_2SiO_{2/2})$$

In the formula, $R^3$ are identical or different monovalent C1-12 hydrocarbon groups; specific examples are C1-12 alkyl groups, C2-12 alkenyl groups, C6-12 aryl groups and C7-12 aralkyl groups as described above, and these groups wherein some or all of the hydrogen atoms are substituted with halogen atoms such as fluorine atoms, chlorine atoms or bromine atoms. At least two $R^3$ per molecule are abovementioned alkenyl groups, preferably vinyl groups. Also, in the formula, n is an integer from 3-20, preferably an integer from 3-10.

Examples of these cyclic organopolysiloxanes are shown below. In the formulae, Vi and Me are as described above.

$$(MeViSiO_{2/2})_3$$

$$(MeViSiO_{2/2})_4$$

$$(MeViSiO_{2/2})_5$$

There are no particular limitations regarding the amount of cyclic organopolysiloxane in component (A); for good mechanical strength of the cured product obtained on curing the inventive composition, the amount is preferably no more than 5% by mass, more preferably no more than 3% by mass, of component (A).

There are no particular limitations regarding the viscosity of component (A); for good workability of the inventive composition, the viscosity at 25° C. is 10-5,000,000 m Pa·s, or preferably 50-1,000,000 mPa·s.

Component (B) is an organopolysiloxane having, per molecule, at least 2 siloxane units represented by the formula RHSiO. In order for the scorch time (ts1) and the 90% vulcanization time [tc(90)] of the inventive composition to be within the abovementioned ranges, an organopolysiloxane having the abovementioned siloxane units must be used as component (B). In the formula, R is a monovalent C1-12 hydrocarbon group having no aliphatic unsaturated bonds; examples are C1-12 alkyl groups, C6-12 aryl groups and C7-12 aralkyl groups as described above, and these groups wherein some or all of the hydrogen atoms are substituted with halogen atoms such as fluorine atoms, chlorine atoms or bromine atoms; it is preferably a methyl group.

There are no particular limitations regarding the molecular structure of component (B); for example, it can be linear, linear with some branching, branched, cyclic, or a three-dimensional network structure. Component (B) may be a single organopolysiloxane having such a molecular structure, or a mixture of two or more organopolysiloxanes having such molecular structures.

Examples of organopolysiloxane resins of branched or three-dimensional network structure are those comprising at least a siloxane unit represented by the formula $R^4{}_3SiO_{1/2}$, a siloxane unit represented by the formula $R^4HSiO_{2/2}$ and a siloxane unit represented by the formula $SiO_{4/2}$; it may contain a siloxane unit represented by the formula $R^4{}_2SO_{2/2}$ and/or a siloxane unit represented by the formula $R^4SiO_{3/2}$, provided that this does not adversely affect the aim of the present invention. Also, these organopolysiloxane resins may have hydroxyl groups or alkoxy groups bonded to silicon atoms within the molecule, provided that this does not adversely affect the aim of the present invention. In this organopolysiloxane resin, with respect to the siloxane unit represented by formula $SiO_{4/2}$, the molar ratio of the siloxane unit represented by formula $R^4{}_3SiO_{1/2}$ is preferably 0.6-1.5, and the molar ratio of the siloxane unit represented by formula $R^4HSiO_{2/2}$ is preferably 1.5-3.

In the formulae, $R^4$ are identical or different monovalent C1-12 hydrocarbon groups having no aliphatic unsaturated carbon bonds; examples are C1-12 alkyl groups, C6-12 aryl groups and C7-12 aralkyl groups as described above, and these groups wherein some or all of the hydrogen atoms are substituted with halogen atoms such as fluorine atoms, chlorine atoms or bromine atoms; preferably they are methyl groups.

The organopolysiloxane resins represented by the average unit formulae below are examples of these organopolysiloxane resins. In the formulae, Me is as described above.

$$(Me_3SiO_{1/2})_{0.23}(MeHSiO_{2/2})_{0.51}(SiO_{4/2})_{0.26}$$

$$(Me_3SiO_{1/2})_{0.24}(MeHSiO_{2/2})_{0.49}(SiO_{4/2})_{0.27}$$

$$(Me_3SiO_{1/2})_{0.24}(Me_2SiO_{2/2})_{0.10}(MeHSiO_{2/2})_{0.40}(SiO_{4/2})_{0.26}$$

Furthermore, examples of organopolysiloxanes that are linear, or linear with some branching, are those comprising at least a siloxane unit represented by the formula $R^4{}_3SiO_{1/2}$, and a siloxane unit represented by the formula $R^4HSiO_{2/2}$ and having no siloxane unit represented by $SiO_{4/2}$; they may also contain siloxane units represented by the formula $R^4{}_2HSiO_{1/2}$, siloxane units represented by the formula $R^4{}_2SiO_{2/2}$ or siloxane units represented by the formula $R^4SiO_{3/2}$, provided that this does not adversely affect the aim of the present invention.

In the formulae, $R^4$ are identical or different monovalent C1-12 hydrocarbon groups having no aliphatic unsaturated carbon bonds; examples are C1-12 alkyl groups, C6-12 aryl groups and C7-12 aralkyl groups as described above, and these groups wherein some or all of the hydrogen atoms are substituted with halogen atoms such as fluorine atoms, chlorine atoms or bromine atoms; preferably they are methyl groups.

The organopolysiloxanes represented by the formulae below are examples of these organopolysiloxanes. In the formulae, Me and Ph are as described above.

$$Me_3SiO\,(MeHSiO)_{35}SiMe_3$$

$$HMe_2SiO\,(Me_2SiO)_{36}Si\,Me_2H$$

Me$_3$SiO (MeHSiO)$_{80}$SiMe$_3$

Me$_3$SiO (Me$_2$SiO)$_{30}$(MeHSiO)$_{30}$SiMe$_3$

Me$_2$PhSiO (MeHSiO)$_{35}$SiMe$_2$Ph

There are no particular limitations regarding the weight average molecular weight (Mw) of component (B), and for good adhesive strength of the cured product obtained on curing the inventive composition it is preferably no lower than 6000, no lower than 8000 or no lower than 10,000.

The amount of component (B) is such that the silicon atom-bonded hydrogen atom content in component (B) is within 0.1-10 moles with respect to 1 mole of the total amount of alkenyl groups in component (A); for good hardness, mechanical properties and adhesiveness of the resulting cured product, it is preferably such that said amount is within 0.5-5 moles, or 0.5-3 moles.

Component (C) is a platinum-group metal hydrosilylation reaction catalyst for promoting hydrosilylation of the inventive composition. Examples of platinum-group metals include platinum, ruthenium, rhodium, palladium, and iridium, and platinum is preferred. Examples of platinum-group metal hydrosilylation reaction catalysts, as component (C), include platinum fine powder, platinum black, chloroplatinic acid, alcohol-modified chloroplatinic acid, chloroplatinic acid-diolefin complex, platinum-olefin complex, platinum bis(acetoacetate), platinum bis(acetylacetonate) and other platinum-carbonyl. complexes, chloroplatinic acid-divinyltetramethyldisiloxane complex, chloroplatinic acid-tetravinyltetramethylcyclotetrasiloxane complex and other chloroplatinic acid-alkenylsiloxane complexes, platinum-divinyltetramethyldisiloxane complex, platinum-tetravinyltetramethylcyclotetrasiloxane complex and other platinum-alkenylsiloxane complexes, and complexes of chloroplatinic acid and acetylene alcohol; for marked promotion of the hydrosilylation reaction, platinum-alkenylsiloxane complexes are preferred.

Examples of the alkenylsiloxanes are 1,3-divinyl-1,1,3,3-tetramethyldisiloxane, 1,3,5,7-tetramethyl-1,3,5,7-tetravinylcyclotetrasiloxane, alkenylsiloxane oligomers in which some of the methyl groups In these alkenylsiloxanes are substituted with ethyl or phenyl groups, or the like, and alkenylsiloxane oligomers in which the vinyl groups in the alkenylsiloxane are substituted with allyl or hexenyl groups, or the like. In particular, 1,3-divinyl-1,1,3,3-tetramethyldisiloxane is preferred for good stability of the platinum-alkenylsiloxane complex produced.

To improve the stability of the platinum-alkenylsiloxane complex, these platinum-alkenylsiloxane complexes are preferably dissolved in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane, or an organosiloxane oligomer such as dimethylsiloxane oligomer, and they are especially preferably dissolved in an alkenylsiloxane oligomer.

The amount of component (C) is such that, with respect to the total amount of components (A) and (B), the amount, in mass units, of platinum-based element in this component is at least 10 ppm, and preferably 10-500 ppm, 10-100 ppm or 10-50 ppm.

This is because when the component (C) content is at or above the lower limit of the abovementioned ranges, the curability . of the inventive composition is good, specifically, the curability at die bonding thicknesses of 10 μm and lower is good; and moreover, when said content is at or below the upper limit of the abovementioned ranges, problems such as coloration of the resulting cured product are unlikely to arise.

Component (D) is a hydrosilylation reaction inhibitor for extending the pot life and improving the storage stability of the inventive composition at room temperature. Examples of component (D) are alkyne alcohols such as 1-ethynylcyclohexan-1-ol, 2-methyl-3-butyn-2-ol, 3,5-dimethyl-l-hexyn-3-ol, 2-phenyl-3-butyn-2-ol; enyne compounds such as 3-methyl-3-penten-1-yne and 3,5-dimethyl-3-hexen-1-yne; silylated alkyne alcohols such as methyltris(1-methyl-1-phenyl-propyneoxy)silane, dimethylbis(1-methyl-1-phenyl-propyneoxy)silane, methyltris(1,1-dimethyl-propyneoxy)silane and dimethylbis(1,1-dimethyl-propyneoxy)silane; and benzotriazoles; it is preferably an alkyne alcohol and/or silylated alkyne alcohol.

The amount of component (D) is preferably 0.0001-5 parts by mass, 0.01-5 parts by mass, or 0.01-3 parts by mass per 100 parts by mass of the total amount of components (A) and (B). This is because when the component (D) content is at or above the lower limit of the abovementioned ranges, it is possible to sufficiently inhibit gelling or curing that can occur when component (A), component (B) and component (C) are mixed, and when it is at or below the upper limit of the abovementioned ranges, it does not markedly lower the vulcanization characteristics of the inventive composition.

It is possible to achieve a scorch time (ts1) of 20-60 seconds at the die bonding temperature, specified in JIS K 6300-2, and a 90% vulcanization time [tc(90)] of 300-500 seconds with respect to the maximum torque value up to a vulcanization time of 600 seconds, by adjusting the amount of component (C), and adjusting the proportion with component (D) and/or the amount of component (D), in the inventive composition.

Component (E) is an adhesiveness-bestowing agent for bestowing the inventive composition with adhesiveness. A commonly known adhesiveness-bestowing agent that can be blended into curable silicone compositions that are cured by a hydrosilylation reaction can be used as this adhesiveness-bestowing agent.

Examples of component (E) are alkoxysilanes such as vinyltrimethoxysilane, allyltrimethoxysilane, allyltriethoxysilane, hydrogen triethoxysilane, 3-glycidoxypropyltrimethoxysilane, 3-glycidoxypropyltriethoxysilane, 2-(3,4-epoxycyclohexyl)ethyltrimethoxysilane, 3-methacryloxypropyltrimethoxysilane, and 3-methacryloxypropyltriethoxysilane; reaction mixtures comprising an alkenyl group-containing diorganosiloxane oligomer having both molecular chain terminals silanol group-blocked, such as dimethylsiloxane-methylvinylsiloxane copolymer oligomer having both molecular chain terminals silanol group-blocked or methylvinylsiloxane oligomer having both molecular chain terminals silanol group-blocked, and an epoxy group-containing alkoxysilane such as 3-glycidoxypropyltrimethoxysilane or 2-(3,4-epoxycyclohexyl)ethyltrimethoxysilane; reaction mixtures comprising an abovementioned alkenyl group-containing diorganosiloxane oligomer having both molecular chain terminals silanol group-blocked and 3-methacryloxypropyltrimethoxysilane; reaction mixtures comprising an abovementioned epoxy group-containing alkoxysilane and 3-aminopropyltriethoxysilane; and tris(3-trimethoxysilylpropyl)isocyanurate; and it is preferably a reaction mixture comprising alkenyl group-containing diorganosiloxane oligomer having both molecular chain terminals silanol group-blocked and an epoxy group-containing alkoxysilane.

The amount of component (E) is 0.01-10 parts by mass, preferably 0.01-5 parts by mass, per 100 parts by mass of the total amount of components (A) and (B). This is because when the component (E) content is at or above the lower limit of the abovementioned ranges, it is possible to bestow the inventive composition with sufficient adhesiveness; and when it is at or below the upper limit of the abovementioned ranges, it is unlikely to cause discoloration of the cured product obtained on curing the inventive composition.

In order to improve the workability and adhesiveness of the inventive composition, it preferably contains (F) fumed silica having a BET specific surface area of 20-200 m$^2$/g. There are no particular limitations relating to the amount of component (F), and for good mechanical properties of the resulting cured product, it is preferably 1-20 parts by mass per 100 parts by mass of the total amount of components (A) and (B).

As optional components, in addition to component (F), inorganic filler such as silica, glass, alumina and zinc oxide; silicone rubber powder; powders of resins such as silicone resin and polymethacrylate resin; and heat-resistant agent, dye, pigment, flame retardant, solvent, etc., may also be incorporated into the inventive composition, provided that the aim of the present invention is not adversely affected.

The inventive composition is cured by heating, and for rapid curing it is preferably heated to 50-200° C.

The inventive composition is preferably cured to form a cured product having a type D durometer hardness, as defined in JIS K 6253-1997 "Hardness testing methods for rubber, vulcanized or thermoplastic", of at least 50, and more preferably to form a cured product having a type D durometer hardness of 50-70. This is because when the hardness is 50 or higher, the cured product has sufficient cohesive force, and sufficient strength and adhesiveness can be achieved under conditions where the film thickness is 10 μm or less; and when the hardness is 70 or lower, the cured product has flexibility and sufficient adhesion can be achieved.

Also, the inventive composition is preferably cured to form a cured product having a flexural strain, as defined in JIS K 7171-1994 "Plastics—Determination of flexural properties", of at least 10%. This is because when the flexural strain is 10% or higher, the cured product has flexibility and sufficient adhesion is achieved.

The inventive composition is such that at the die bonding temperature the scorch time (ts1) is 20-60 seconds, as measured by MDR (moving die rheometer), and the 90% vulcanization time [tc(90)] is 300-500 seconds; an example of a method for obtaining such a curable composition is to use as component (B) an organopolysiloxane having per molecule at least 2 siloxane units represented by the formula RHSiO, and to adjust the amount of component (C) or adjust the type and amount of component (D). It should be noted that the measurement by MDR is performed as stipulated in JIS K 6300-2 "Rubber, unvulcanized—Physical property— Part 2: Determination of cure characteristics with oscillating curemeters", and the same applies to the definitions of the scorch time (ts1) and the 90% vulcanization time [tc(90)].

By achieving such curability, it is possible to realise sufficient curability at 150° C., which is the die bonding temperature usually adopted when using die bonding agent for LEDs having a film thickness of 10 μm or less. If the scorch time (ts1) and/or 90% vulcanization time [tc(90)] are below their abovementioned respective lower limits, curing proceeds too quickly and it is not possible to achieve sufficient adhesive strength, and if they are above their abovementioned respective upper limits, curing proceeds too slowly, such that sufficient curing cannot be achieved by curing for 2 hours at 150° C., which constitutes usual die bonding conditions.

EXAMPLES

The inventive curable silicone composition for die bonding use is described in more detail by means of examples and comparative examples. It should be noted that viscosity refers to the value at 25° C. In the examples and comparative examples, the following components were used to adjust the curable silicone compositions for die bonding use. In the formulae, Vi represents a vinyl group and Me represents a methyl group.

The following components were used as component (A).

(a1): Dimethylpolysiloxane having both molecular chain terminals dimethylvinylsiloxy group-blocked and having a viscosity of 60 mPa·s (vinyl group content=1.53% by mass)

(a2): Dimethylpolysiloxane having both molecular chain terminals dimethylvinylsiloxy group-blocked and having a viscosity of 350 mPa·s (vinyl group content=0.45% by mass)

(a3): Cyclic methylvinylpolysiloxane represented by average formula (MeViSiO)$_4$ 
and having a viscosity of 4 mPa·s (vinyl content=30% by mass)

(a4): Methylvinylpolysiloxane represented by average formula

HO(MeViSiO)$_2$OH and having a viscosity of 30 mPa·s (vinyl content=30% by mass)

(a5): Organopolysiloxane resin represented by average unit formula (Me$_2$ViSiO$_{1/2}$)$_{0.55}$(Me$_3$SiO$_{1/2}$)$_{0.05}$(SiO$_{4/2}$)$_{0.40}$ and having a viscosity of 300 mPa·s (vinyl content=19.0% by mass)

(a6): Organopolysiloxane resin represented by average unit formula (Me$_2$ViSiO$_{1/2}$)$_{0.15}$(Me$_3$SiO$_{1/2}$)$_{0.45}$(SiO$_{4/2}$)$_{0.40}$ and having a viscosity of 350 mPa·s (vinyl content=5.1% by mass)

(a7): Organopolysiloxane resin represented by average unit formula (Me$_2$ViSiO$^{1/2}$)$_{0.09}$(Me$_3$SiO$_{1/2}$)$_{0.43}$(SiO$_{4/2}$)$_{0.48}$(HO$_{1/2}$)$_{0.03}$ that is solid at room temperature (vinyl content=3.0% by mass)

(a8): Organopolysiloxane resin represented by average unit formula (Me$_2$ViSiO$_{1/2}$)$_{0.10}$(Me$_3$SiO$_{1/2}$)$_{0.45}$(SO$_{4/2}$)$_{0.45}$(HO$_{1/2}$)$_{0.02}$ that is solid at room temperature (vinyl content=3.0% by mass)

The following components were used as component (B).

(b1): Organopolysiloxane resin represented by average unit formula (Me$_3$SiO$_{1/2}$)$_{0.23}$(MeHSiO$_{2/2}$)$_{0.51}$(SiO$_{4/2}$)$_{0.26}$ and having a viscosity of 2000 mPa·s (weight average molecular weight=18,000, silicon atom-bonded hydrogen atom content=0.78% by mass)

(b2): Organopolysiloxane resin represented by average unit formula $$(Me_3SiO_{1/2})_{0.24}(MeHSiO_{2/2})_{0.40}(SiO_{2/2})_{0.27}$$

and having a viscosity of 510 mPa·s (weight average molecular weight=16,300, silicon atom-bonded hydrogen atom content=0.75% by mass)

(b3): Organopolysiloxane represented by average formula $$Me_3SiO\ (MeHSiO)_{36}SiMe_3$$

and having a viscosity of 10 mPa·s (weight average molecular weight=8,800, silicon atom-bonded hydrogen atom content=1.6% by mass)

(b4): Organopolysiloxane resin represented by average unit formula $$(HMe_2SiO_{1/2})_{0.67}(SiO_{4/2})_{0.33}$$

and having a viscosity of 120 mPa·s (weight average molecular weight=1310, silicon atom-bonded hydrogen atom content=0.95% by mass)

The following component was used as component (C).
(c): 1,3-Divinyl-1,1,3,3-tetramethyldisiloxane solution of a 1,3-divinyl-1,1,3,3-tetramethyldisiloxane complex of platinum having a platinum metal content of approximately 4% by weight The following components were used as component (D).
(d1): Methyltris(1-methyl-1-phenyl-propynoxy)silane
(d2): 1-Ethynylcyclohexan-1-ol The following component was used as component (E).
(e): Condensation product of 3-glycidoxypropyltrimethoxysilane and methylvinylsiloxane oligomer having both molecular chain terminals silanol group-blocked, where the condensation product has a viscosity of 30 mPa·s at 25° C.

The following component was used as component (F).
(1): Fumed silica having a BET specific surface area of 115-165 m²/g where the surface has been hydrophobized using hexamethyldisilazane (trade name: RX200 manufactured by Nippon Aerosil Co., Ltd.)

In the examples and comparative examples, the vulcanization characteristics of the curable silicone compositions for die bonding use and the properties of the cured products were measured as follows.

Measurement of Scorch Time ts1 and 90% Vulcanization Time tc(90)

These were measured by vulcanizing the curable silicone composition for die bonding use for 600 seconds at a common die bonding temperature (150° C.) in accordance with the method stipulated in JIS K 6300-2:2001 "Rubber, unvulcanized—Physical property—Part 2: Determination of cure characteristics with oscillating curemeters", using a Curelastometer (Premier MDR manufactured by Alpha Technologies). It should be noted that measurement was started when 5 ml of the curable liquid silicone composition was placed on the lower die and the upper die was closed.

The measurements were performed using an R-type die for rubber, with an amplitude angle of 0.5°, a vibration frequency of 100/minute, and a torque range of up to 230 kgf·cm.

Hardness of Cured Product

The curable silicone composition for die bonding use was press-molded at 150° C. for 2 hours to produce sheet-like cured product. The hardness of this sheet-like cured product was measured as stipulated in JIS K 6253-1997 "Hardness testing methods for rubber, vulcanized or thermoplastic" using a type D durometer.

Flexural Strain of Cured Porduct

The curable silicone composition for die bonding use was heated at 150° C. for 2 hours to produce the cured product. The flexural strain (%) of the cured product was found in accordance with the method stipulated in JIS K 7171-1994 "Plastics—Determination of flexural properties".

Chip Die Shear Strength

The curable silicone composition for die bonding use was coated onto an LED substrate using a die bonder (AD830 PLUS, manufactured by ASM), then a 300 μm² LED chip was placed thereon, and the resulting system was cured under curing conditions at 150° C. for 2 hours. The chip die strength was then measured using a die shear tester (DAGE 4000 Bondtester, manufactured by Nordson DAGE).

Working Examples 1-4, Comparative Examples 1-8

The curable silicone compositions for die bonding use were prepared in accordance with the compositions shown in Table 1 and Table 2. It should be noted that in Table 1 and Table 2, "SiH/Vi" represents the value of the total number of moles of silicon atom-bonded hydrogen atoms in component (B) per mole of the total amount of vinyl groups in component (A). The vulcanization characteristics of the curable silicone compositions and the properties of the cured products are also shown in Table 1 and Table 2.

TABLE 1

| Category Item | | | Present invention | | | | Comparative examples | |
|---|---|---|---|---|---|---|---|---|
| | | | Example 1 | Example 2 | Example 3 | Example 4 | Comparative example 1 | Comparative example 2 |
| Components of curable silicone composition (parts by mass) | (A) | (a1) | 20.8 | — | 22.6 | — | 20.8 | 20.8 |
| | | (a2) | — | 22.3 | — | 23.6 | — | — |
| | | (a3) | 1.4 | — | 1.6 | — | 1.4 | 1.4 |
| | | (a4) | — | 2.4 | — | 3 | — | — |
| | | (a5) | 2.6 | — | 2.4 | — | 2.6 | 2.6 |
| | | (a6) | — | — | — | — | — | — |
| | | (a7) | 48.5 | — | 52.7 | — | 48.5 | 48.5 |
| | | (a8) | — | 52 | — | 55 | — | — |
| | (B) | (b1) | 14.7 | — | — | — | 14.7 | 14.7 |
| | | (b2) | — | 14 | — | — | — | — |
| | | (b3) | — | — | 7.5 | 7 | — | — |
| | | (b4) | — | — | — | — | — | — |
| | (C) | (c) | 0.05 | 0.05 | 0.05 | 0.05 | 0.01 | 0.025 |
| | (D) | (d1) | 0.06 | 0.06 | 0.05 | 0.05 | — | 0.05 |
| | | (d2) | — | — | — | — | 0.01 | — |

TABLE 1-continued

|  |  | Present invention | | | | Comparative examples | |
|---|---|---|---|---|---|---|---|
| Category Item | | Example 1 | Example 2 | Example 3 | Example 4 | Comparative example 1 | Comparative example 2 |
| (E) | (e) | 3 | 3 | 3 | 3 | 3 | 3 |
| (F) | (f) | 9 | 6.3 | 10.2 | 8.4 | 9 | 9 |
| SiH/Vi | | 1.15 | 1.19 | 1.13 | 1.14 | 1.15 | 1.15 |
| ts1 (sec) | | 48 | 56 | 30 | 40 | 17 | 79 |
| tc(90) (sec) | | 404 | 432 | 368 | 412 | 572 | 551 |
| Hardness | | 60 | 60 | 59 | 58 | 55 | 57 |
| Flexural strain (%) | | 11.7 | 11.3 | 12.5 | 12.3 | 13.3 | 12.2 |
| Chip die shear strength (gf) | | 267 | 277 | 272 | 261 | 45 | 104 |

TABLE 2

|  |  | Comparative examples | | | | | |
|---|---|---|---|---|---|---|---|
| Category Item | | Comparative example 3 | Comparative example 4 | Comparative example 5 | Comparative example 6 | Comparative example 7 | Comparative example 8 |
| Components (A) of curable silicone composition (parts by mass) | (a1) | 20.8 | 22.6 | 22.4 | 22.7 | 22.7 | 22.7 |
| | (a2) | — | — | — | — | — | — |
| | (a3) | 1.4 | 1.6 | 1.6 | 1.5 | 1.5 | 1.5 |
| | (a4) | — | — | — | 2 | — | — |
| | (a5) | 2.6 | 2.4 | — | — | — | — |
| | (a6) | — | — | 2 | — | — | — |
| | (a7) | 48.5 | 52.7 | — | 53.0 | 53.0 | 53.0 |
| | (a8) | — | — | 52.2 | — | — | — |
| (B) | (b1) | 14.7 | — | — | — | — | — |
| | (b2) | — | — | — | — | — | — |
| | (b3) | — | 7.5 | 8.57 | 3.4 | 3.4 | 3.4 |
| | (b4) | — | — | — | 6.8 | 6.8 | 6.8 |
| (C) | (c) | 0.025 | 0.04 | 0.025 | 0.025 | 0.04 | 0.04 |
| (D) | (d1) | — | 0.06 | 0.03 | — | — | 0.04 |
| | (d2) | 0.03 | — | — | 0.03 | 0.01 | — |
| (E) | (e) | 3 | 3 | 3 | 3 | 3 | 3 |
| (F) | (f) | 9 | 10.2 | 10.1 | 9.6 | 9.6 | 9.6 |
| SiH/Vi | | 1.15 | 1.13 | 1.49 | 1.35 | 1.35 | 1.35 |
| ts1 (sec) | | 107 | 50 | 16 | 72 | 16 | 23 |
| tc(90) (sec) | | 512 | 510 | 308 | 442 | 270 | 290 |
| Hardness | | 59 | 57 | 57 | 55 | 57 | 57 |
| Flexural strain (%) | | 12.1 | 12.1 | 12.3 | 13.3 | 12.9 | 12.9 |
| Chip die shear strength (gf) | | 199 | 144 | 151 | 182 | 202 | 187 |

INDUSTRIAL APPLICABILITY

The inventive composition can firmly adhere a semiconductor element to a support, and is therefore suitable as a die bonding agent for semiconductor elements such as light emitting diodes (LEDs), semiconductor lasers, photodiodes, phototransistors, solid-state imaging, light emitters and photoreceptors for photocouplers.

The invention claimed is:
1. A curable silicone composition for die bonding use, comprising at least
(A) 100 parts by mass of organopolysiloxane having at least 2 alkenyl groups per molecule,
(B) organopolysiloxane having, per molecule, at least 2 siloxane units represented by the formula RHSiO (in the formula, R is a monovalent C1-12 hydrocarbon group having no aliphatic unsaturated bonds) {in an amount such that the molar ratio of the silicon atom-bonded hydrogen atoms in this component with respect to the alkenyl groups in component (A) is 0.1-10},
(C) platinum-group metal hydrosilylation reaction catalyst in an amount such that the amount, in mass units, of platinum-group metal in this component is 10 ppm with respect to the total amount of components (A) and (B),
(D) 0.001-5 parts by mass of hydrosilylation reaction inhibitor per 100 parts by mass of the total amount of components (A) and (B), and
(E) 0.01-10 parts by mass of adhesiveness-bestowing agent per 100 parts by mass of the total amount of components (A) and (B),
wherein the scorch time (ts1) is 20-60 seconds at the die bonding temperature, specified in JIS K 6300-2, and, with respect to the maximum torque value up to a vulcanization time of 600 seconds, the 90% vulcanization time [tc(90)] is 300-500 seconds.
2. The curable silicone composition for die bonding use as claimed in claim 1, where component (A) contains an organopolysiloxane resin comprising at least
a siloxane unit represented by the formula $R^1_3SiO_{1/2}$ (in the formula, $R^1$ is an identical or different monovalent C1-12 hydrocarbon group having no aliphatic unsaturated bonds), a siloxane unit represented by the formula $R^1_2R^2SiO_{1/2}$ (in the formula, $R^1$ is as described above, and $R^2$ is a C2-12 alkenyl group), and a siloxane unit represented by the formula $SiO_{4/2}$, wherein the molar ratio of the total amount of siloxane units represented by formula $R^1{}_3SiO_{1/2}$ and siloxane units represented by formula $R^1{}_2R^2SiO_{1/2}$, with respect to the siloxane unit represented by formula $SiO_{4/2}$, is 0.5-1.6.

3. The curable silicone composition for die bonding use as claimed in claim 2, where component (B) is an organopolysiloxane resin comprising at least a siloxane unit represented by the formula $R^4{}_3SiO_{1/2}$ (in the formula, $R^4$ is an identical or different monovalent C1-12 hydrocarbon group having no aliphatic unsaturated bonds), a siloxane unit represented by the formula $R^4HSiO_{2/2}$ (in the formula, $R^4$ is as described above), and a siloxane unit represented by the formula $SiO_{4/2}$, wherein the molar ratio of the siloxane unit represented by formula $R^4{}_3SiO_{1/2}$ is 0.6-1.5 and the molar ratio of the siloxane unit represented by formula $R^4HSiO_{2/2}$ is 1.5-3, with respect to the siloxane unit represented by formula $SiO_{4/2}$.

4. The curable silicone composition for die bonding use as claimed in claim 2, where component (B) is an organopolysiloxane comprising at least a siloxane unit represented by the formula $R^4{}_3SiO_{1/2}$ (in the formula, $R^4$ is an identical or different monovalent C1-12 hydrocarbon group having no aliphatic unsaturated bonds), a siloxane unit represented by the formula $R^4HSiO_{2/2}$ (in the formula, $R^4$ is as described above), and having no siloxane units represented by the formula $SiO_{4/2}$.

5. The curable silicone composition for die bonding use as claimed in claim 1, where component (B) is an organopolysiloxane resin comprising at least a siloxane unit represented by the formula $R^4{}_3SiO_{1/2}$ (in the formula, $R^4$ is an identical or different monovalent C1-12 hydrocarbon group having no aliphatic unsaturated bonds), a siloxane unit represented by the formula $R^4HSiO_{2/2}$ (in the formula, $R^4$ is as described above), and a siloxane unit represented by the formula $SiO_{4/2}$, wherein the molar ratio of the siloxane unit represented by formula $R^4{}_3SiO_{1/2}$ is 0.6-1.5 and the molar ratio of the siloxane unit represented by formula $R^4HSiO_{2/2}$ is 1.5-3, with respect to the siloxane unit represented by formula $SiO_{4/2}$.

6. The curable silicone composition for die bonding use as claimed in claim 1, where component (B) is an organopolysiloxane comprising at least a siloxane unit represented by the formula $R^4{}_3SiO_{1/2}$ (in the formula, $R^4$ is an identical or different monovalent C1-12 hydrocarbon group having no aliphatic unsaturated bonds), and a siloxane unit represented by the formula $R^4HSiO_{2/2}$ (in the formula, $R^4$ is as described above), and having no siloxane units represented by the formula $SiO_{4/2}$.

7. The curable silicone composition for die bonding use as claimed in claim 1, where component (D) is an alkyne alcohol and/or silylated alkyne alcohol.

8. The curable silicone composition for die bonding use as claimed in claim 1, where component (E) is a reaction mixture comprising epoxy group-containing alkoxysilane and alkenyl group-containing diorganosiloxane oligomer having both molecular chain terminals silanol group-blocked.

9. The curable silicone composition for die bonding use as claimed in claim 1, further comprising (F) fumed silica having a BET specific surface area of 20-200 m²/g at 1-20 parts by mass per 100 parts by mass of the total amount of components (A) and (B).

10. The curable silicone composition for die bonding use as claimed in claim 1, which when cured forms a cured product having a type D durometer hardness, as defined in JIS K 6253-1997, of at least 50.

11. The curable silicone composition for die bonding use as claimed in claim 1, which when cured forms a cured product having a flexural strain, as defined in JIS K 7171-1994, of at least 10%.

12. The curable silicone composition for die bonding use as claimed in claim 1, for adhering LED elements to substrates.

\* \* \* \* \*